United States Patent [19]
Oda et al.

[11] Patent Number: 5,270,242
[45] Date of Patent: Dec. 14, 1993

[54] METHOD FOR FABRICATINS DYNAMIC RANDOM ACCESS MEMORY DEVICE HAVING A CAPACITOR FOR STORING IMPACT IONIZATION CHARGES

[75] Inventors: Hidekazu Oda; Kiyoteru Kobayashi; Takehisa Yamaguchi, all of Hyogo, Japan

[73] Assignee: Mitsubishi Denki Kabushiki Kaisha, Tokyo, Japan

[21] Appl. No.: 17,903

[22] Filed: Feb. 16, 1993

Related U.S. Application Data

[62] Division of Ser. No. 568,567, Aug. 16, 1990, Pat. No. 5,218,217.

[30] Foreign Application Priority Data

Aug. 31, 1989 [JP] Japan .................................. 1-227952
Feb. 28, 1990 [JP] Japan .................................. 2-50399

[51] Int. Cl.$^5$ ...................... H01L 21/70; H01L 27/00
[52] U.S. Cl. ........................................ 437/52; 437/47; 437/60; 437/919
[58] Field of Search ...................... 437/52, 62, 29, 919

[56] References Cited

U.S. PATENT DOCUMENTS 4,112,575  6/1978  Fu .
4,959,709  9/1990  Watanabe ............................ 257/304
4,961,165  10/1990  Ema ..................................... 365/182

FOREIGN PATENT DOCUMENTS 60-250665  12/1985  Japan .
61-255056  11/1986  Japan .
2-244767   9/1990   Japan .................................. 365/185

OTHER PUBLICATIONS

Chynoweth, "Uniform Silicon p-n Junctions. II. Ionization Rates for Electrons", *Journal of Applied Physics*, vol. 31, No. 7 (Jul. 1960), pp. 1161-1165.

*Primary Examiner*—Robert M. Kunemund
*Assistant Examiner*—H. Jey Tsai
*Attorney, Agent, or Firm*—Lowe, Price, LeBlanc & Becker

[57] ABSTRACT

Each memory cell of a dynamic random access memory comprises a semiconductor layer of a first conductivity type, one and the other impurity regions of a second conductivity type, a gate electrode, a capacitor impurity region of the first conductivity type, and a capacitor electrode. The semiconductor layer of the first conductivity type comprises a first surface and a second surface located opposite to the first surface. One and the other impurity regions are formed spaced apart from each other in the semiconductor layer so as to define a channel region with a channel surface being a part of the first surface of the semiconductor layer. The gate electrode is formed on the channel surface through a gate insulating film. The capacitor impurity region is formed opposing to the channel region, near the second surface of the semiconductor layer and having a concentration higher than that of the semiconductor layer. The capacitor electrode is formed on the capacitor impurity region through a dielectric film. Reduced surface area occupied by each memory cell comprising a field effect transistor and a capacitor enables miniaturization of the memory cell. Electric charges generated by the impact ionization phenomenon are stored in the capacitor, so that a power consumed in a writing operation of data can be reduced.

3 Claims, 10 Drawing Sheets

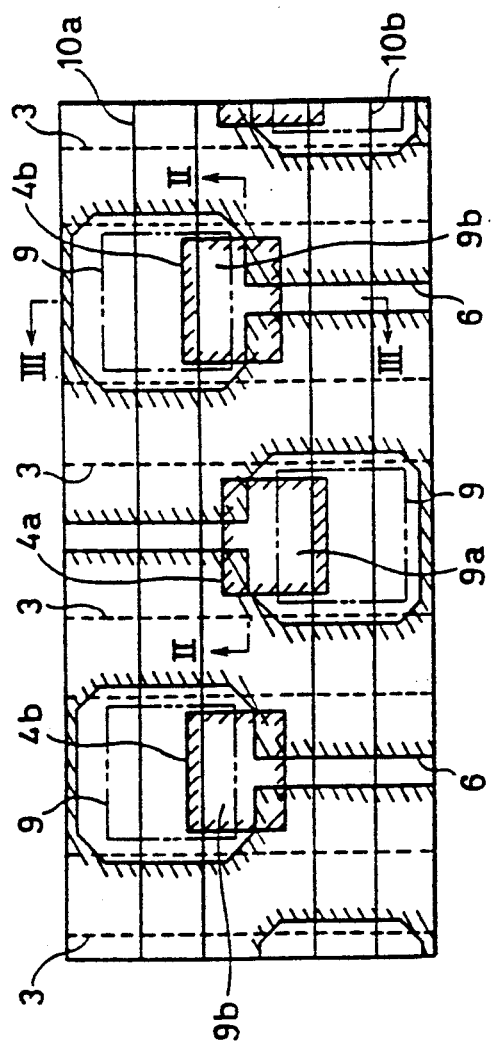
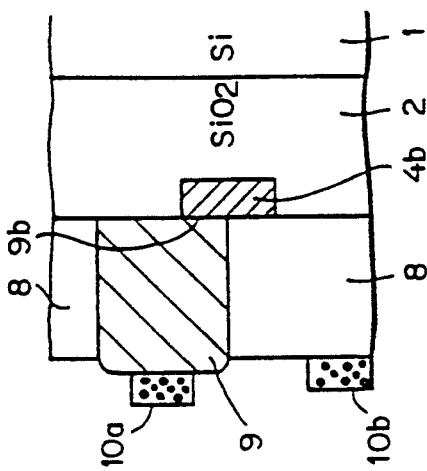
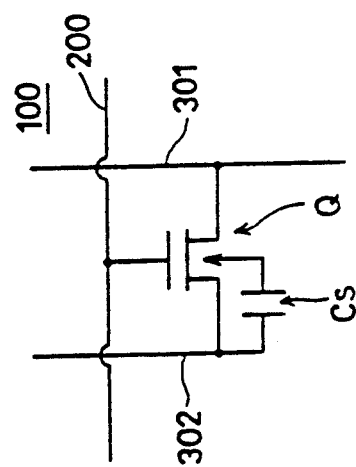
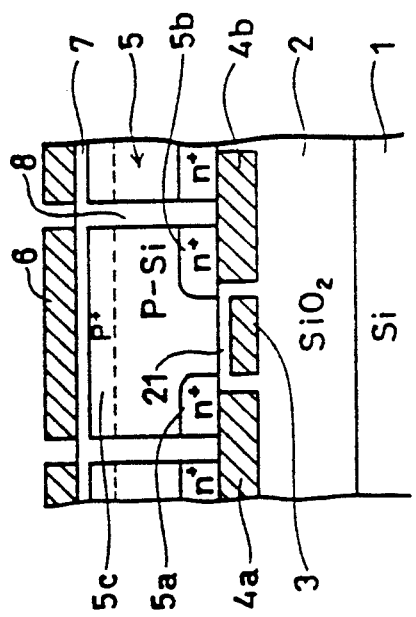

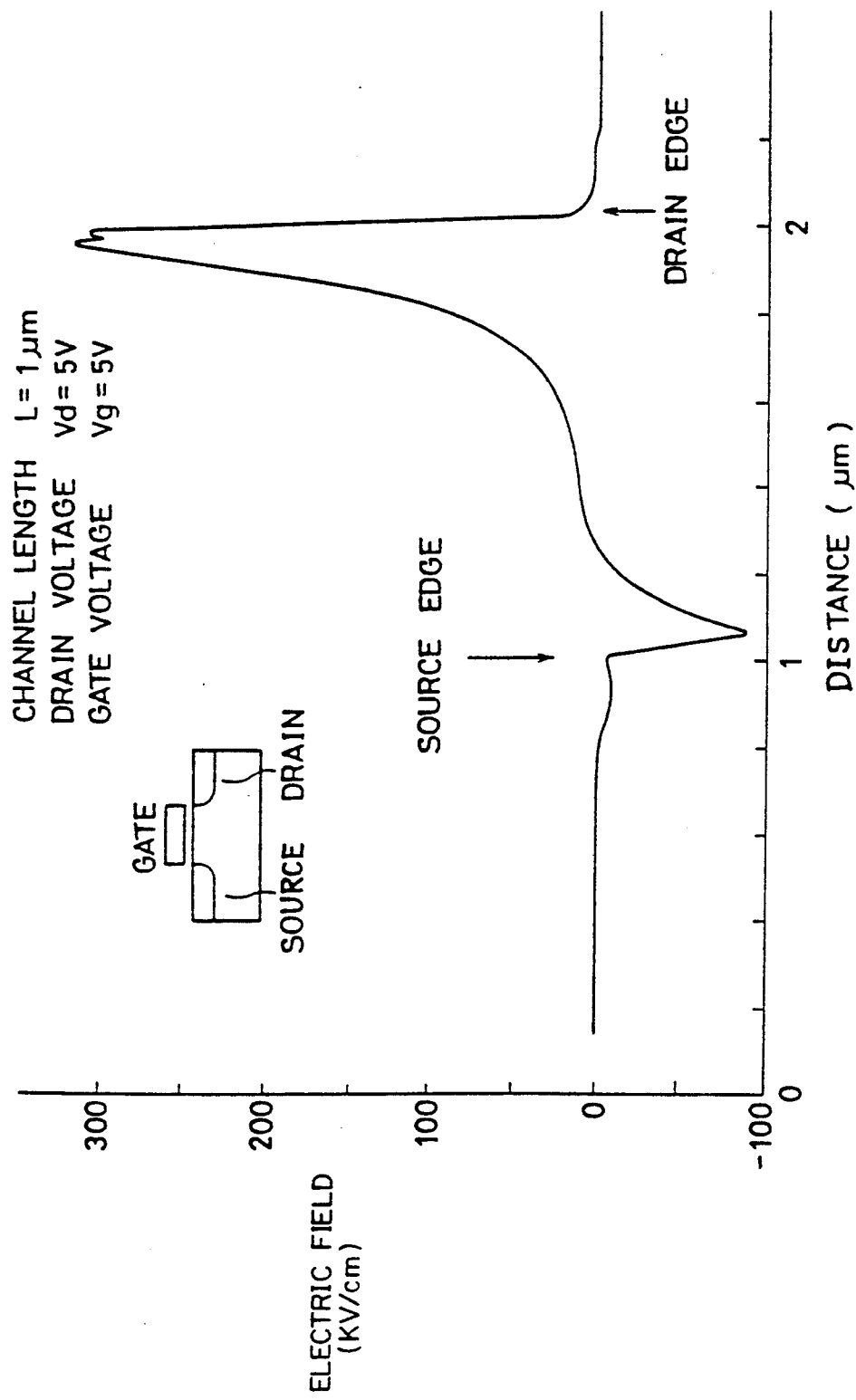

METHOD FOR FABRICATING DYNAMIC RANDOM ACCESS MEMORY DEVICE HAVING A CAPACITOR FOR STORING IMPACT IONIZATION CHARGES

This application is a divisional application of application Ser. No. 07/568,567, filed Aug. 16, 1990, now U.S. Pat. No. 5,218,217.

BACKGROUND OF THE INVENTION

1. Field of the Invention

The present invention relates generally to dynamic random access type of semiconductor memory devices and a method of manufacturing thereof, and more particularly, semiconductor memory devices having memory cells structured by a single field effect transistor and a single capacitor, for example, dynamic random access memory (referred to as DRAM hereinafter) and a method of manufacturing the same.

2. Description of the Background Art

DRAM is already well known as shown in, for example, U.S. Pat. No. 4,112,575. FIG. 9 is a block diagram showing one example of an entire structure for a conventional DRAM.

Referring to FIG. 9, the DRAM comprises a memory cell array 1000 including a plurality of memory cells as a memory portion, a row decoder 2000 and a column decoder 3000 connected to address buffers for selecting an address of a memory cell, and an input/output interface portion including a sense amplifier connected to an input/output circuit. The plurality of memory cells of the memory portion are provided in matrix of a plurality of rows and columns. Each memory cell is connected to a corresponding word line connected to the row decoder 2000 and a corresponding bit line connected to the column decoder 3000, thereby forming the memory cell array 1000. A single word line and a single bit line are respectively selected from the row decoder 2000 and the column decoder 3000 by receiving externally applied row address signal and column address signal, thereby selecting a memory cell. Data is written into the selected memory cell or the data stored in the memory cell is read out. Instructions of the data writing/reading are given by a writing/reading control signal applied to a control circuit.

Data is stored in the memory cell array 1000 of N (=n×m) bits. Address information of a memory cell to which writing/reading is performed is stored in the row and column address buffers. Memory cells of m bits are coupled to the sense amplifiers through bit lines by a selection of a particular word line (selection of a single word line among n word lines) by means of the row decoder 2000. Then, one of the sense amplifiers is coupled to the input/output circuit by a selection of a particular bit line (selection of a single bit line among m bit lines) by means of the column decoder 3000, so that writing or reading is performed in accordance with instructions of the control circuit.

FIG. 10 is an equivalent circuit showing a memory cell 100 of a conventional DRAM illustrated for explaining writing/reading operation of a memory cell. According to the drawing one memory cell 100 comprises a pair of field effect transistor Q and a capacitor Cs. A gate electrode of the field effect transistor Q is connected to a word line 200, one of source/drain electrodes is connected to one electrode of the capacitor Cs, and the other of the source/drain electrodes is connected to a bit line 300. In data writing, the field effect transistor Q is rendered conductive by an application of a predetermined voltage to the word line 200, so that electric charges applied to the bit line 300 is stored in the capacitor Cs. On the other hand, in data reading, the field effect transistor Q is rendered conductive by the application of a predetermined voltage to the word line 200, so that the electric charges stored in the capacitor Cs is read out through the bit line 300.

FIG. 11 is a partial plan view showing a plane arrangement of a memory cell array portion of a conventional DRAM having a folded bit line structure. FIG. 12 is a sectional view taken along a line XII—XII of FIG. 11.

A structure and an operation of a conventional memory cell will be described in the following with reference to these drawings.

One memory cell is structured by an n channel MOS transistor and a capacitor formed on a major surface of a p type silicon substrate 101. The n channel MOS transistor comprises a gate electrode 103, and n+ impurity diffusion regions 104a and 104b which are to be source and drain regions. The n+ impurity diffusion regions 104a and 104b are formed spaced apart from each other on the major surface of the p type silicon substrate 101 so as to define a channel region with a channel surface being a part of the major surface of the silicon substrate 101. The gate electrode 103 is formed on the channel region through a gate oxide film 121. Each of the n+ impurity diffusion regions 104a and 104b is isolated between the adjacent MOS transistors through a silicon oxide film 102 for isolation. The gate electrode 103 is formed as a word line. A capacitor electrode 106 is formed so as to connect with the n+ diffusion region 104a through a capacitor oxide film 107 as a dielectric film. A bit line 110 is connected to the n+ impurity diffusion region 104b through a contact hole 109. An interlayer insulating film 108 is formed between the bit line 110, the word line 103 and the capacitor electrode 106.

Writing operation using a memory cell structured as the foregoing will be described. First, in writing "1" operation, a predetermined voltage is applied beforehand to the n+ impurity diffusion region 104b through the bit line 110. Then, the n channel MOS transistor is turned on by the application of a predetermined voltage to the gate electrode 103. As a result, electrons in the n+ impurity diffusion region 104a are drawn out to the n+ impurity diffusion region 104b side, as indicated by an arrow A of FIG. 12, whereby a potential of the n+ impurity diffusion region 104a is raised to be the same as that of the n+ impurity diffusion region 104b. Since the n+ impurity region 104a is structured so as to oppose to the capacitor electrode 106, electric charges induced by the capacitor electrode 106 are increased as a rise of the potential of the n+ impurity diffusion region 104a. This state is stored in a memory cell as data of "1".

In writing "0" operation, the potential of the n+ impurity diffusion region 104b is set to 0V through the bit line 110. The n channel MOS transistor is turned on by an application of a predetermined voltage to the gate electrode 103. At this time, since the potential of the n+ impurity diffusion region 104a is higher than the potential of the n+ impurity diffusion region 104b, as indicated by an arrow B in FIG. 12, electrons are injected from the n+ impurity diffusion region 104b to the n+ impurity diffusion region 104a, causing the potential of the n+ impurity diffusion region 104a to fall. As a result, the electric charges induced by the capacitor electrode 106 opposing to the n+ impurity diffusion region 104a are reduced. This state is stored in a memory cell as data of "0".

In recent years, with the improvement of the manufacturing technique, attempts have been made in highly integrating and miniaturizing a memory cell of a DRAM which is a semiconductor memory device. However, even if a memory cell is miniaturized, a predetermined amount of electric charges should be sufficiently stored as information in each memory cell. Therefore, the surface area occupied by a capacitor portion cannot be smaller above a certain limit, which sets limits to miniaturization of the DRAM. In addition, even if high integration of the memory cell is intended, a power consumed in an entire DRAM is large even though a power consumed in each memory cell is small.

SUMMARY OF THE INVENTION

An object of the present invention is to minimize the size of each memory cell in semiconductor memory device.

Another object of the present invention is to reduce power consumption in a semiconductor memory device.

A further object of the present invention is to reduce power consumption in a high density dynamic random access memory.

Still another object of the present invention is to manufacture a high density semiconductor memory device.

A still further object of the present invention is to manufacture a low power consumption semiconductor memory device.

A still further object of the present invention is to manufacture a high density and low power consumption dynamic random access memory.

A semiconductor memory device according to the present invention comprises a semiconductor layer of a first conductivity type, one and the other impurity regions of a second conductivity type, a gate electrode, a capacitor impurity region of the first conductivity type and a capacitor electrode. The semiconductor layer of the first conductivity type includes a first surface, and a second surface located opposite to the first surface. One and the other impurity regions are formed spaced apart from each other in the semiconductor layer so as to define a channel region with a channel surface being a part of the first surface of the semiconductor layer. The gate electrode is formed on the channel surface through a gate insulating film. The capacitor impurity region is formed near the second surface of the semiconductor layer so as to oppose to the channel region and has a concentration higher than that of the semiconductor layer. The capacitor electrode is formed on the capacitor impurity region through a dielectric film.

A method of manufacturing a semiconductor memory device according to the present invention comprises the following steps.

(a) Forming a gate electrode on a major surface of an insulation layer.

(b) Forming a gate insulating film on a surface of the gate electrode.

(c) Forming a semiconductor layer of a first conductivity type having a first surface in contact with the major surface of the insulation layer and the surface of the gate insulating film, and a second surface located opposite to the first surface.

(d) Forming one and the other impurity regions of a second conductivity type located spaced apart from each other in the semiconductor layer so as to define a channel region with a channel surface being a part of the semiconductor layer.

(e) Forming a capacitor impurity region of the first conductivity type having a concentration higher than that of the semiconductor layer so as to oppose to the channel region near the second surface of the semiconductor layer.

(f) Forming a capacitor electrode on the capacitor impurity region through a dielectric film.

In the present invention, a field effect transistor structured by one and the other impurity regions of a second conductivity type and a gate electrode is located on a first surface of a semiconductor layer of a first conductivity type. A capacitor structured by a capacitor impurity region of the first conductivity type and a capacitor electrode is located on a second surface opposite to the first surface. Therefore, the surface area occupied by each memory cell comprising a field effect transistor and a capacitor is smaller compared to that of a conventional semiconductor memory device. Accordingly, a memory cell can be miniaturized.

On the other hand, the capacitor impurity region is formed so as to oppose to a channel region of the field effect transistor, so that electric charges flowing into a depletion layer under the channel region among electrons and holes generated by impact ionization are stored in the capacitor impurity region. Therefore, a larger amount of electric charges generated by impact ionization can be stored in the capacitor impurity region, even if the amount of a current flowing between the impurity regions of the field effect transistor is small. Accordingly, the structure of the memory cell of the present invention serves for reduction of a power consumed in a data writing operation in a memory cell.

According to another aspect of the present invention, the semiconductor memory device comprises a semiconductor layer of a first conductivity type, a plurality of word lines, a plurality of bit lines and a plurality of memory cells. The semiconductor layer includes a first surface, and a second surface located opposite to the first surface. The word lines are formed on the first surface and extend in a predetermined direction. The bit lines are formed on the second surface and comprises first and second bit lines extending in a direction intersecting with the word lines. The memory cells are arranged at intersections between the word lines and the bit lines. Each memory cell includes one and the other impurity regions of a second conductivity type, a gate electrode, a capacitor impurity region of the first conductivity type and a capacitor electrode. One and the other impurity regions of the second conductivity type are formed spaced apart from each other in the semiconductor layer so as to define a channel region with a channel surface being a part of the first surface of the semiconductor layer. The gate electrode is formed on the channel surface through a gate insulating film and connected to the word lines. The capacitor impurity region is formed so as to oppose to the channel region near the second surface of the semiconductor layer and has an impurity concentration higher than that of the semiconductor layer. The capacitor electrode is formed on the capacitor impurity region through a dielectric film. The first and second bit lines are connected to one and the other impurity regions, respectively. The second bit lines are connected to the capacitor electrode.

According to a preferred embodiment of the semiconductor memory device in accordance with the present invention, an insulation layer is formed on a first surface side of a semiconductor layer. A gate electrode is formed embedded in the insulation layer. One and the other electrodes are formed on the first surface so as to connect with one and the other impurity regions.

According to a preferred embodiment of a method of manufacturing a semiconductor memory device according to the present invention, the gate electrode is formed by forming a concave portion on a major surface of the insulation layer and forming a conductor layer so as to fill in the concave portion.

Although the present invention has been described and illustrated in detail, it is clearly understood that the same is by way of illustration and example only and is not to be taken by way of limitation, the spirit and scope of the present invention being limited only by the terms of the appended claims.

BRIEF DESCRIPTION OF THE DRAWINGS

FIG. 1 is a partial plan view showing a plane arrangement of a memory cell of a DRAM as a semiconductor memory device according to the present invention.

FIG. 2 is a partially sectional view showing a section taken along a line II—II of FIG. 1.

FIG. 3 is a partially sectional view showing a section taken along a line III—III of FIG. 1.

FIG. 4 is an equivalent circuit diagram showing a memory cell according to the present invention.

FIG. 7 is a graph showing a field intensity distribution in the direction of channel length of an n channel field effect transistor having a channel length of 1 μm.

DESCRIPTION OF THE PREFERRED EMBODIMENTS

Figure 5:
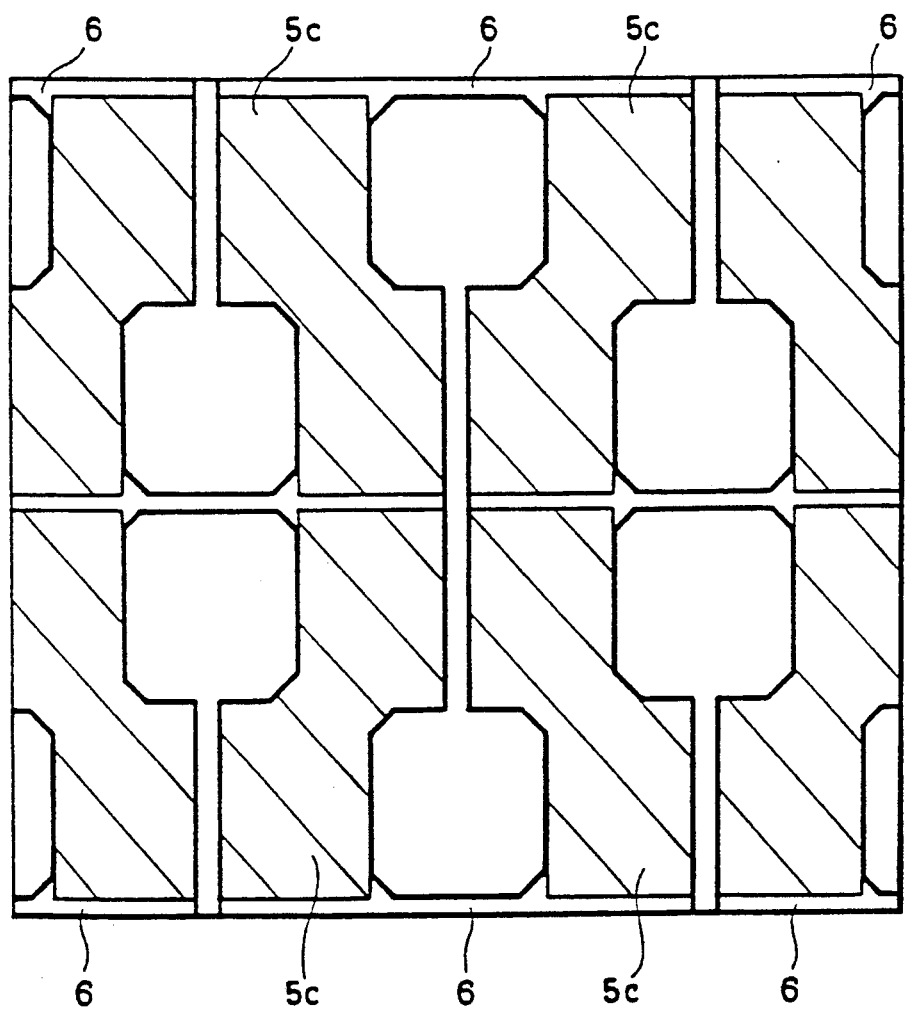
FIG. 5 is a partial plan view showing an arrangement of a capacitor electrode and a capacitor diffusion region in a plane arrangement of memory cells according to the present invention.

With reference to FIGS. 1 through 5, a silicon oxide film 2 as an insulating layer is formed on a silicon substrate 1. Island-shaped p type silicon layers 5 isolated from each other through an isolating silicon oxide film 8 are formed on the silicon oxide film 2. A plane arrangement of the p type silicon layers 5 is shown as an arrangement of regions occupied by a capacitor diffusion regions 5c shown by the hatched region in FIG. 5. First and second n+ impurity diffusion regions 5a and 5b which will be source/drain regions are formed spaced apart from each other on an lower surface of the p type silicon layer 5. Source/drain electrodes 4a and 4b are formed in the silicon oxide film 2 so as to be in contact with the n+ impurity diffusion regions 5a and 5b. Source/drain electrodes are formed to be shared by two n+ impurity diffusion regions isolated through the silicon oxide film B. A gate electrode 3 is formed through a gate oxide film 21 on a lower surface of a channel region defined by the n+ impurity diffusion regions 5a and 5b. The gate electrode 3 also serves as a word line. The capacitor diffusion region 5c is formed opposing to the channel region, near an upper surface of the p type silicon layer 5. The capacitor diffusion region 5c is formed as a p+ impurity region having an impurity concentration higher than that of the p type silicon layer 5. The capacitor diffusion region 5c is formed in each memory cell insulated from each other by the silicon oxide film 8. A capacitor electrode 6 is formed on the whole surface so as to cover the capacitor diffusion region 5c. A capacitor oxide film 7 is interposed between the capacitor electrode 6 and the capacitor diffusion region 5c. Although it is not shown in FIG. 1, the capacitor electrodes 6 are electrically connected to the bit lines in a peripheral portion of the memory cell array region.

As shown in FIG. 3, a bit line 10a (10b) is electrically connected to a source electrode or a drain electrode 4b (4a) through a contact conductive layer 9. The contact conductive layer 9 is formed locating in a hole provided in the capacitor electrode 6. The source electrode or the drain electrode 4b (4a) is connected to the contact conductive layer 9 through a contact region 9b (9a).

Thus, a capacitor portion is formed on an upper surface side of the silicon layer 5 and the field effect transistor is formed on a lower surface side. Therefore, the area occupied by each memory cell can be smaller. In addition, while surface areas occupied by the n+ impurity diffusion regions 5a and 5b corresponding to the source or drain electrode 4a or 4b are reduced, region occupied by the capacitor diffusion region 5c is increased up to a maximum as shown in FIG. 5.

Referring to FIG. 4, an operation using a memory cell of the present invention will be described. First, in writing "1" operation, for example, a voltage of 5V is applied to a bit line 301 (10a), and a voltage of 0V is applied to a bit line 302 (10b). A voltage of 5V is applied to a word line 200 (3), thereby turning the field effect transistor on. The potential of the n+ impurity diffusion region 5b is held to a voltage of 5V through the drain electrode 4b connected to the bit line 301 (10a). On the other hand, the potential of the n+ impurity diffusion region 5a is held to 0V through the source electrode 4a connected to the bit line 302 (10b), so that electrons in the n+ impurity diffusion region 5a flow into the n+ impurity diffusion region 5b.

As a memory cell is miniaturized, especially in a MOS transistor having a short channel length, an electric field in the direction of channel length is remarkably increased near a drain, if the drain voltage is increased. Therefore, electrons accelerated by the strong electric field near an end portion of the n+ impurity diffusion region 5b easily enter a high energy state in the channel region. The electrons in the high energy state collide with the lattice of silicons near the end portion of the drain region to generate a large amount of pairs of electrons and holes like an avalanche. This phenomenon is referred to as impact ionization phenomenon. The electrons among the electrons and the holes generated by the impact ionization phenomenon are drawn to a high drain field to flow into the drain region, which will be a part of the drain current. On the other hand, the holes are drawn back by the drain field to flow into the substrate side. Such phenomenon is observed not only in a short channel MOS transistor but also in a relatively long channel MOS transistor. Especially in the short channel MOS transistor, much larger numbers of electrons and holes are generated as compared with the long channel MOS transistor. The holes flowing into the substrate side become a part of the substrate current in a structure of a conventional memory cell.

However, in the structure of the memory cell shown in FIG. 2, since no electrode exists on the substrate side of the MOS transistor, the substrate region of the MOS transistor is in a floating state. Therefore, the holes are stored in the p type silicon layer 5 as a substrate region. The p+ capacitor diffusion region 5c having a hole density higher than that near the source region is formed on the substrate region side. Accordingly, the holes flowing into the substrate region side are absorbed into the capacitor diffusion region 5c, causing the potential of the capacitor diffusion region 5c to rise, which is followed by the increase of electric charges induced into the capacitor electrode 6 formed opposing to the capacitor diffusion region 5c. This state is stored as the data "1" in a memory cell. Since the writing operation utilizes the impact ionization phenomenon, a large number of holes can be generated even if a writing signal is weak. Accordingly, the writing signal is amplified so that the writing operation can be performed.

In writing "0" operation, a voltage of 0V is applied to the bit line 301 (10a) and a voltage of 5V is applied to the bit line 302 (10b). A voltage of 5V is applied to the word line 200. At this time, a positive potential is provided to the capacitor electrode 6 through the bit line 302, so that the holes stored in the capacitor diffusion region 5c migrate into the p type silicon layer 5, causing a potential of the p type silicon layer 5 to rise. A potential of the n+ impurity diffusion region 5b is held to 0V through the bit line 301 (10a). Therefore, the holes in the p type silicon layer 5 flow to the n+ impurity diffusion region 5b along a forward direction of the pn junction, wherein the n channel MOS transistor is turned on. However, a potential of the capacitor electrode 6 is also held to 5V through the bit line 302 (10b). Therefore, no holes are absorbed into the capacitor diffusion region 5c.

In reading operation, a voltage of 0V is applied to the bit line 301 (10a) and a voltage of 5V is applied to the word line 200. At this time, it is determined by a potential appearing on the bit line 302 (10b) whether electric charges stored in the capacitor exist or not.

Figure 6:
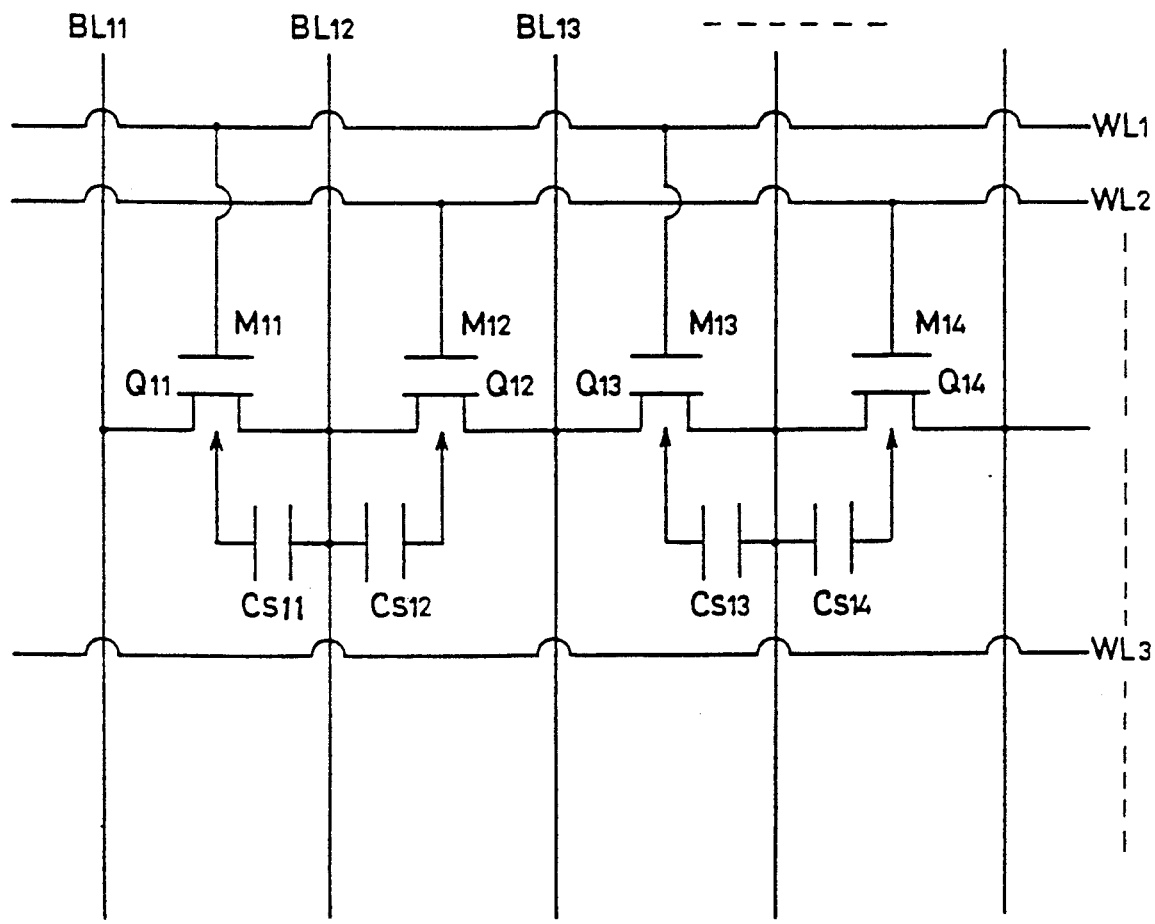
FIG. 6 is an equivalent circuit diagram showing a part of a memory cell array having memory cells according to the present invention being arranged in matrix.

Referring to FIG. 6, note a memory cell M11. The memory cell M11 comprises a field effect transistor Q11 and a capacitor Cs11. In writing "1" in this memory cell M11, a "high" potential is applied to the bit line BL11 and a "low" potential is applied to the bit line BL12. The "high" potential is applied to the word line WL1. As a result, the data of "1" is stored in the capacitor Cs11, as the above described electric charges are transferred. In addition, in the "0" writing operation, the "low" potential is applied to the bit line BL11 and the "high" potential is applied to the bit line BL12. The "high" potential is applied to the word line WL1. Meanwhile, in the reading operation, the "low" potential and the "high" potential are applied to the bit line BL11 and the word line WL1, respectively. On this occasion, it is determined by a potential appearing on the bit line BL12 whether there exist or not the electric charges stored in the capacitor.

Now description will be given to a principle of the structure of a memory cell according to the present invention which contributes reduction of a power consumption necessary for writing operation of data in the memory cell. Taking impact ionization by electrons as an example, the number of carriers generated by the impact ionization and the number of carriers in the channel region which emigrate from the source region to the the drain region will be compared in the following.

Impact ionization rate $a_n$ for electrons will be represented as the following equation. The equation can be obtained following the article "Uniform Silicon p-n Junctions. II. Ionization Rates for Electrons" A. G. Chynoweth, Journal of Applied Physics Vol. 31, No. 7 (July, 1960).

$$a_n = 3.80 \times 10^6 \exp\left(\frac{-1.75 \times 10^6}{E}\right) \qquad \text{(i)}$$

wherein
$a_n$: impact ionization rate (/cm)
E: field intensity (V/cm)

The number of carriers generated by the impact ionization will be given by the following equation.

$$\alpha = \frac{|Jn|}{q} \; (/\text{cm}^3 \cdot \text{sec}) \qquad \text{(ii)}$$

wherein
Jn: electronic current density
q: charge amount of electron ($=1.6 \times 10^{-19}$c)

The electronic current density Jn will be given by the following equation.

$$Jn = qn\mu Ef = qnv \qquad \text{(iii)}$$

wherein
n: electron density (/cm$^3$)
$\mu$: electron mobility
Ef: gradient of quasi Fermi level
v: electron speed (cm/sec)

The electron density n will be represented as follows using the equation (iii).

$$n = \frac{|Jn|}{q \cdot \mu \, |Ef|} = \frac{|Jn|}{q \cdot |v|} \qquad \text{(iv)}$$

Now assuming that electrons migrate in the channel region at a speed of $v_x$ (cm/sec) per sec. from the source region to the drain region, that is, in x direction, wherein the number N of electrons which migrate in the channel region per second will be represented as the following equation.

$$\begin{aligned} N &= Vx \cdot ndydz \\ &= \frac{|Jn|}{q} \cdot dy \cdot dz \; (/\text{sec}) \end{aligned} \qquad \text{(v)}$$

Accordingly, the ratio M of the number of carriers generated by the impact ionization to the number of electrons N migrating in the channel region will be represented as the following equation.

$$M = \frac{\text{(amount of carriers generated by the ionization)}}{N}$$

$$= \frac{\alpha_n \cdot \frac{|J_n|}{q} \cdot dx \cdot dy \cdot dz}{\frac{|J_n|}{q} \cdot dy \cdot dz} = \alpha_n \cdot dx$$

Now assuming that a channel length is 1 μm, the following equation will be $dx = 1 \times 10^{-4}$ (cm), that is, $$M = \alpha_n \times 10^{-4}$$

As a result, it can be seen that the impact ionization rate $\alpha_n$ should be more than $10^4$ in order that the number of carriers generated by the impact ionization is larger than that of the electrons emigrating in the channel region. The field intensity E will be calculated as the following by substituting $\alpha_n = 1 \times 10^4$ for the equation (i).

$$E = \frac{1.75 \times 10^6}{\ln 3.8 + 6\ln 10 - 4\ln 10}$$

$$= 2.956 \times 10^5 \text{ (V/cm)}$$

From the value of the field intensity E, it will be understood that in an n channel field effect transistor having a channel length of 1 μm, the amount of carriers generated by the impact ionization will be larger than the number of electrons migrating in the channel region when a drain voltage is applied such that the maximum field intensity will be $3 \times 10^5$ (V/cm) or more.

FIG. 7 is a graph showing a field intensity distribution of an n channel field effect transistor having a channel length of 1 μm in the direction of channel length. The field intensity distribution is obtained from the result of simulation. According to the graph, it is shown that the following equation will be given near a drain edge on the condition that the drain voltage Vd is 5V and the gate voltage Vg is 5V.

$$E_{max} > 300 \text{ (kV/cm)} = 3 \times 10^5 \text{ (V/cm)}$$

Accordingly, when the channel length is 1 μm or less, the number of carriers generated by the impact ionization will be larger than the number of carriers migrating in the channel region. In the present invention, the carriers generated by the impact ionization will be electric charges stored in the capacitor. Therefore, more electric charges can be stored in the capacitor than the electric charges by the carriers in a conventional channel region when the same voltage is applied. This means that using the impact ionization phenomenon, a large amount of electric charges can be generated to be stored in the capacitor even if the amount of currents flowing between the source and drain regions of the field effect transistor is small. As a result, the structure of the memory cell of the present invention can contribute to the reduction of a power consumption required for writing operation of data in the memory cell.

FIGS. 8A to 8K are partially sectional views showing a sequential step of one example of a method of manufacturing a memory cell of a DRAM according to the present invention. Referring to these figures, the method of manufacturing the memory cell of the present invention will be described in the following. The description of the manufacturing method will be given for a single memory cell.

Figure 8A:
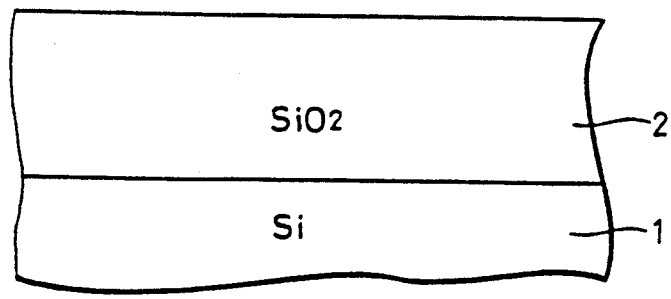
FIGS. 8A, 8B, 8C, 8D, 8E, BF, 8G, 8H, 8I, 8J and 8K are partially sectional views showing a sequential step of a method of manufacturing a memory cell of a DRAM according to the present invention.

First, referring to FIG. 8A, a thick silicon oxide film 2 is formed on a major surface of a silicon substrate 1. The oxide film is formed by the chemical vapor deposition method (CVD method) or the thermal oxidation process.

Figure 8B:
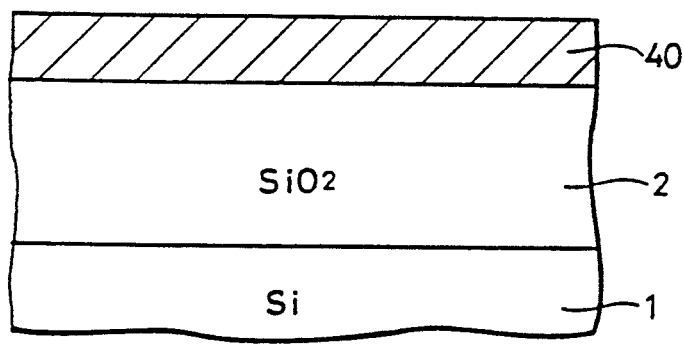

Referring to FIG. 8B, a polycrystalline silicon layer 40 in which n type impurities on the order of $2.0 \times 10^{20}/\text{cm}^3$ are doped is formed on the silicon oxide film 2 using the CVD method.

Figure 8C:
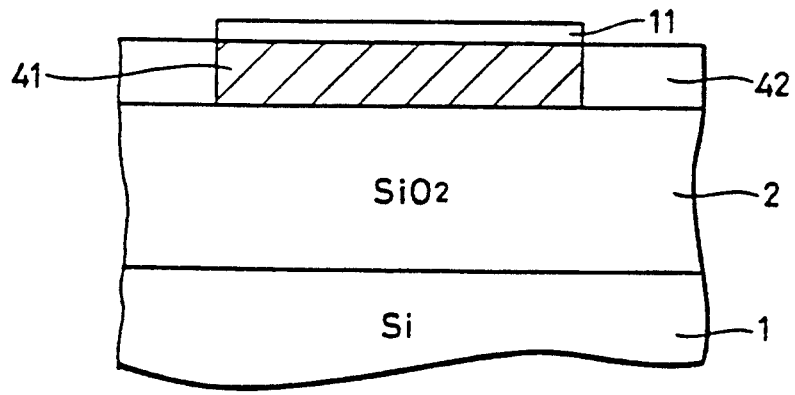

Referring to FIG. 8C, a silicon nitride film 11 is formed in a predetermined region of the n type polycrystalline silicon layer 40. The oxidation process is performed on the whole surface using the silicon nitride film 11 as a mask, thereby forming a silicon oxide film 42 formed by oxidation of the polycrystalline silicon in the region not covered with the silicon nitride film 11. The region covered with the silicon nitride film 11 remains the n type polycrystalline silicon layer 41.

Figure 8D:
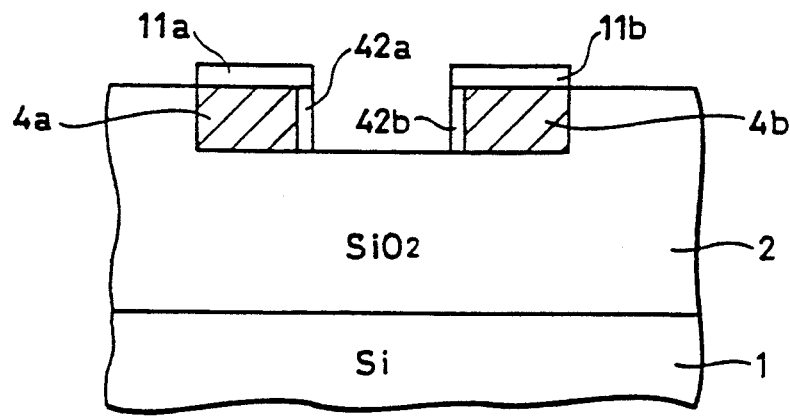

As shown in FIG. 8D, the n type polycrystalline silicon layer 41 is removed by etching using patterned silicon nitride films 11a and 11b as masks. Thereafter, silicon oxide films 42a and 42b are formed on side surfaces of n type polycrystalline silicon layers 4a and 4b by the thermal oxidation process using the silicon nitride film 11a and 11b as mask.

Figure 8E:
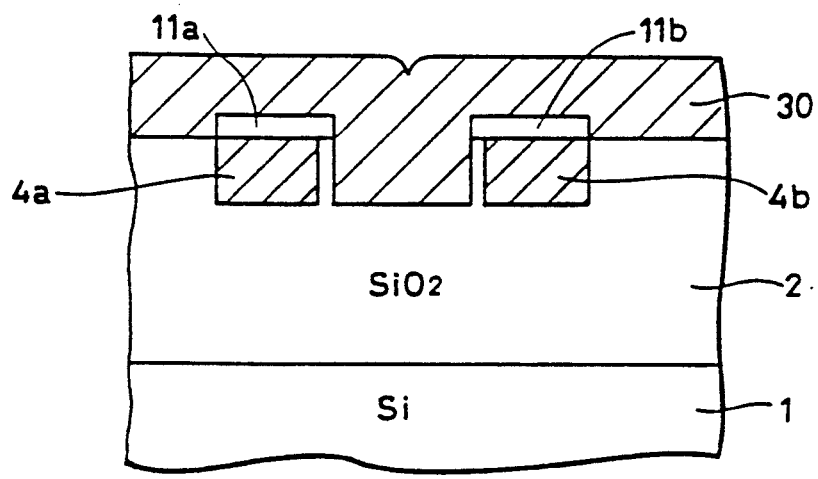

As shown in FIG. 8E, a polycrystalline silicon layer 30 in which n type impurities are doped is deposited so as to fill in a concave portion of the silicon oxide film 2.

Figure 8F:
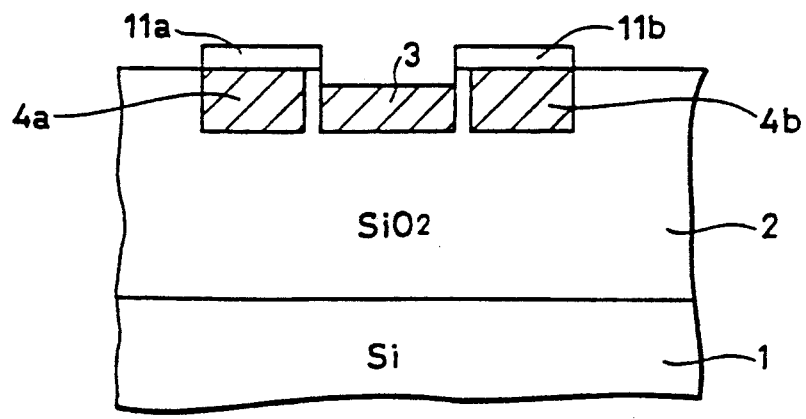

As shown in FIG. 8F, the n type polycrystalline silicon layer 30 is selectively removed by etch-back. At this time, an end point of the etching of the n type polycrystalline silicon layer 30 is set such that it is a little more etched from the surfaces of the silicon nitride films 11a and 11b. Since the silicon nitride film is more immune from etching than the polycrystalline silicon layer, the n type polycrystalline silicon layers 4a and 4b which are already formed are protected by the silicon nitride films 11a and 11b without being etched. Thus a gate electrode 3 having a gate length on the order of 1 μm, source/drain electrodes 4a and 4b are formed.

Figure 8G:
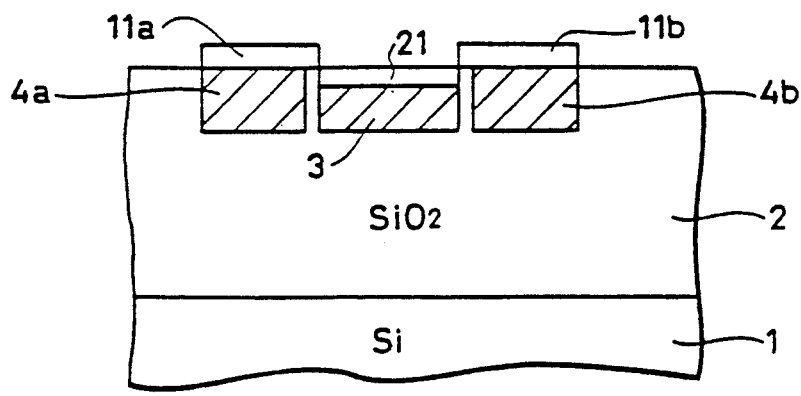

Referring to FIG. 8G, a gate oxide film 21 is formed to have a film thickness on the order of 200 Å on the gate electrode 3.

Figure 8H:
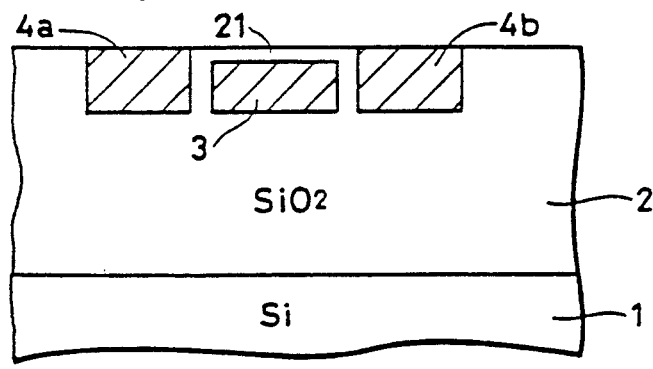

Referring to FIG. 8H, the silicon nitride films 11a and 11b on the source/drain electrodes 4a and 4b are removed by etching.

Figure 8I:
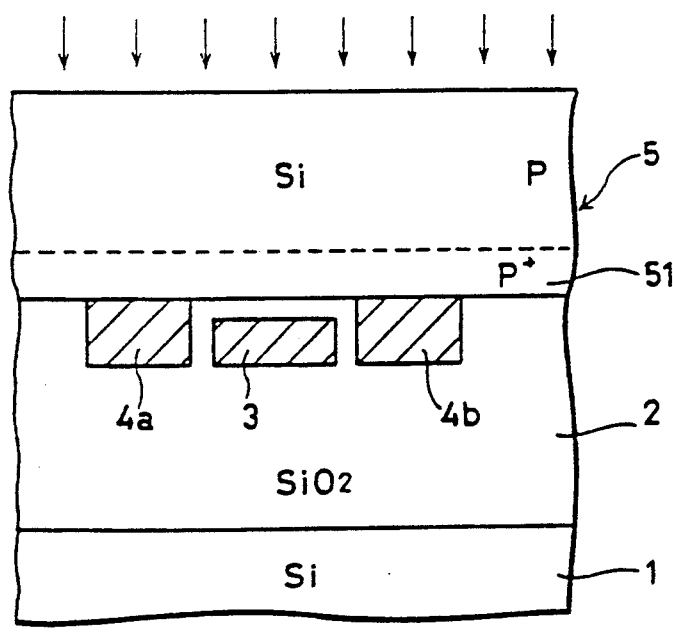

Referring to FIG. 8I, a p type silicon layer 5 is formed to have a film thickness more than 1 μm on a whole surface of the silicon oxide film 2. The silicon layer is formed due to single-crystallization by the laser annealing after deposition of the polycrystalline silicon layer. The p type silicon layer 5 is monocrystallized with its direction aligned with the silicon substrate 1 by using the silicon substrate 1 as a seed. Thereafter, ions of the p type impurity are injected in a direction indicated by an arrow in order to control a threshold voltage, so that a p+ silicon region 51 is formed in the p type silicon layer 5. Impurity concentration of the p type silicon layer 5 is on the order of $3 \times 10^{16}/\text{cm}^3$.

Figure 8J:
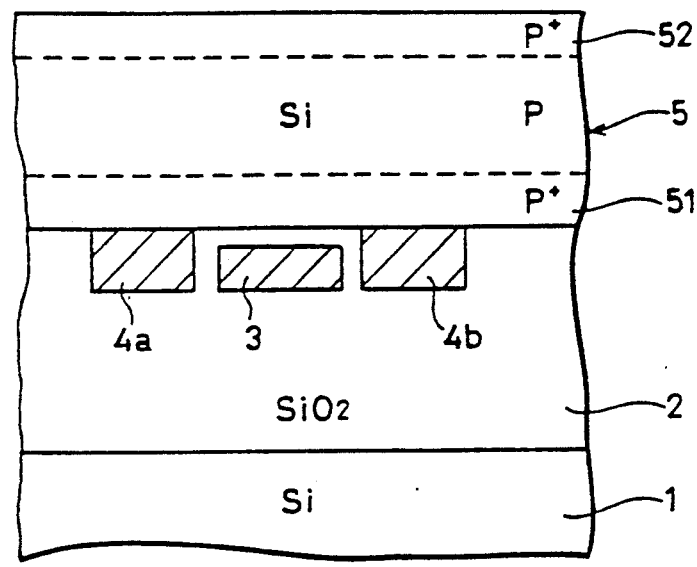

As shown in FIG. 8J, a p+ silicon layer 52 as a capacitor diffusion region is formed so as to have a film thickness on the order of 0.3 μm on or in an upper portion of the p type silicon layer 5 by ion injection or epitaxial growth method. Impurity concentration of this p+ type silicon layer 52 is on the order of $10^{18}/\text{cm}^3$.

Figure 8K:
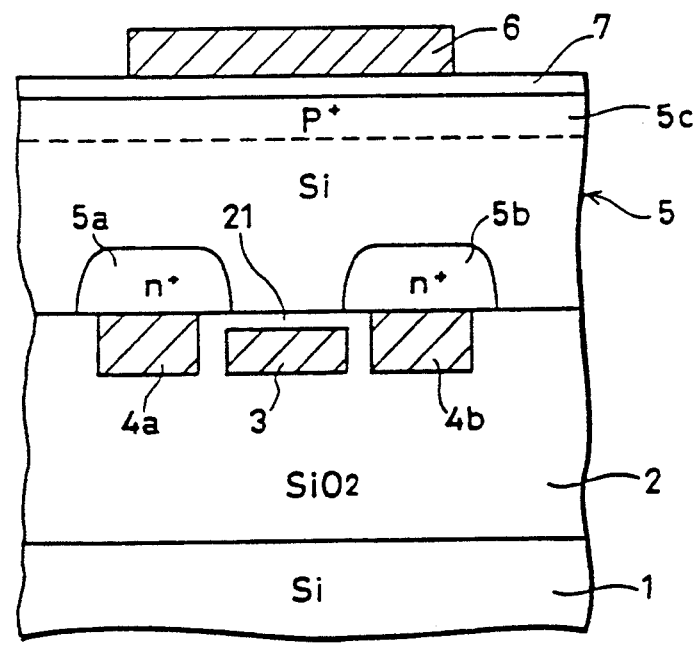
Figure 9:
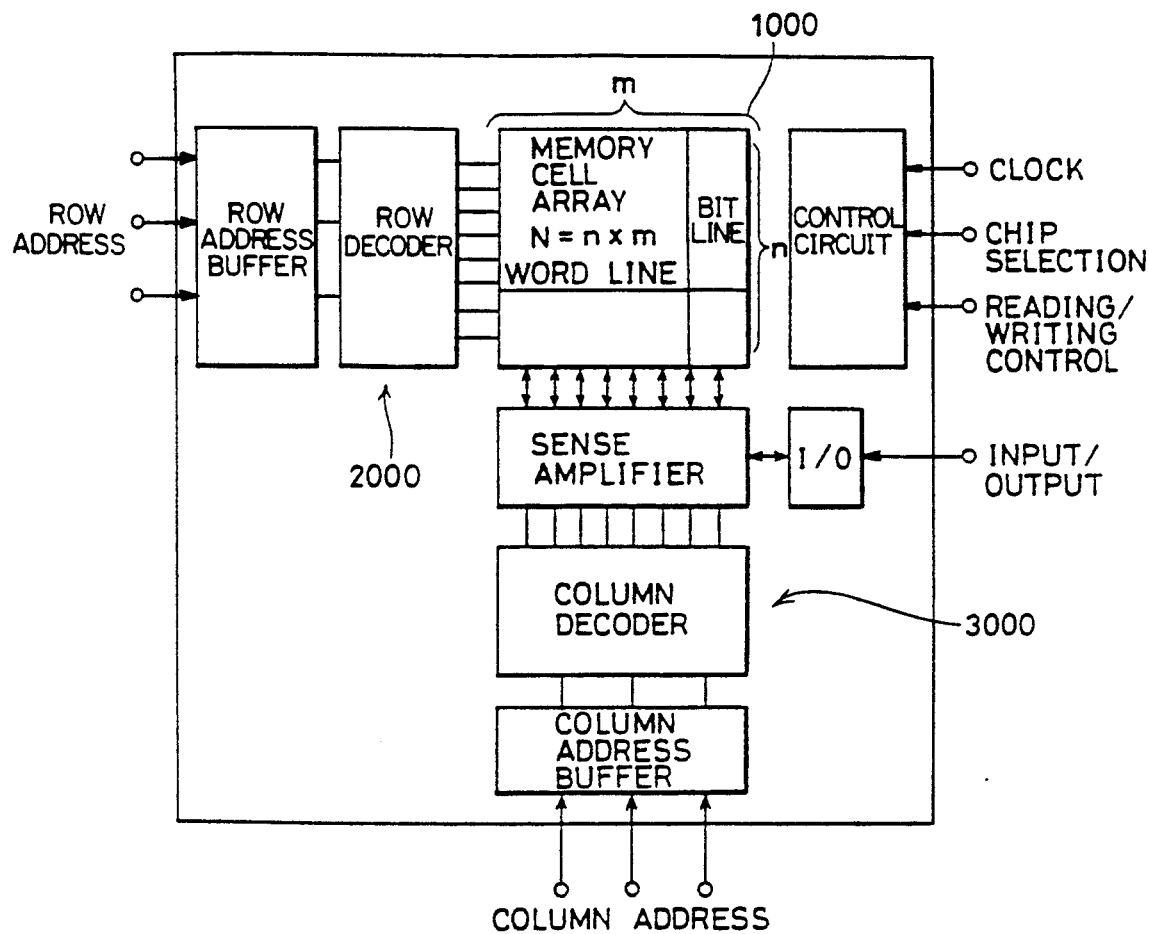
FIG. 9 is a block diagram showing one example of an entire structure of a conventional DRAM.
Figure 10:
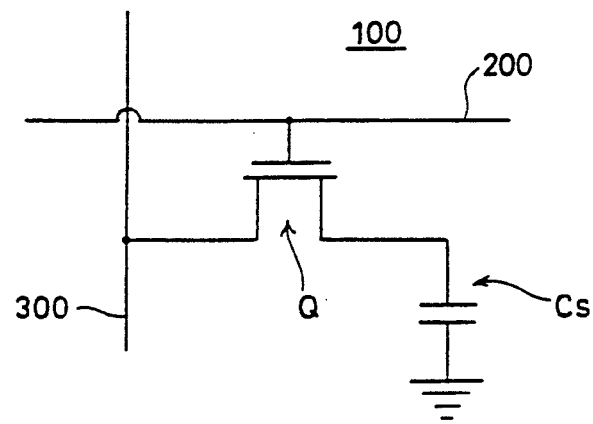
FIG. 10 is an equivalent circuit diagram showing a memory cell of a conventional DRAM.
Figure 11:
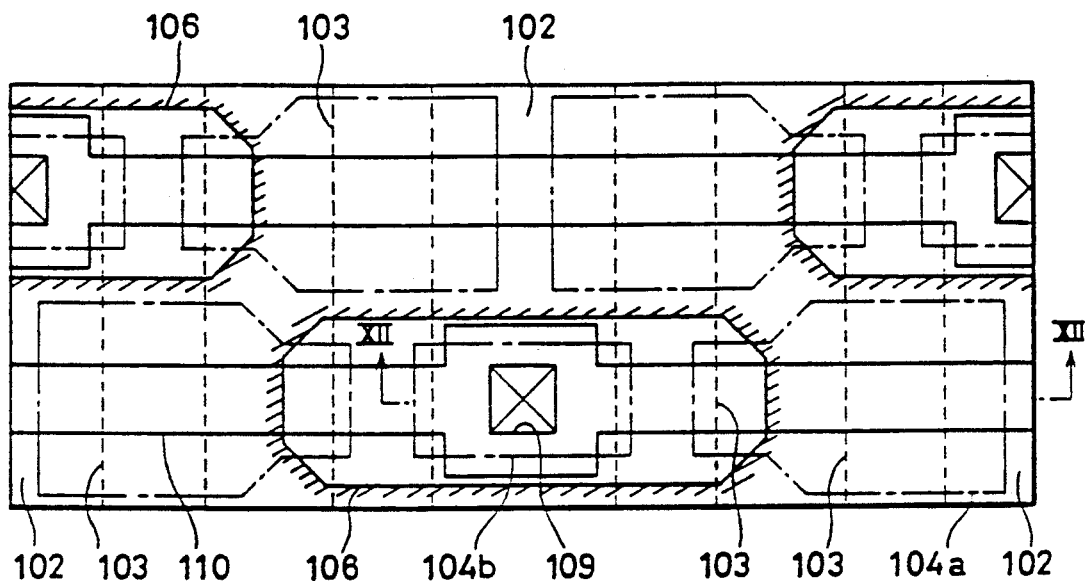
FIG. 11 is a partial plan view showing a plane arrangement of a memory cell array portion of a conventional DRAM.
Figure 12:
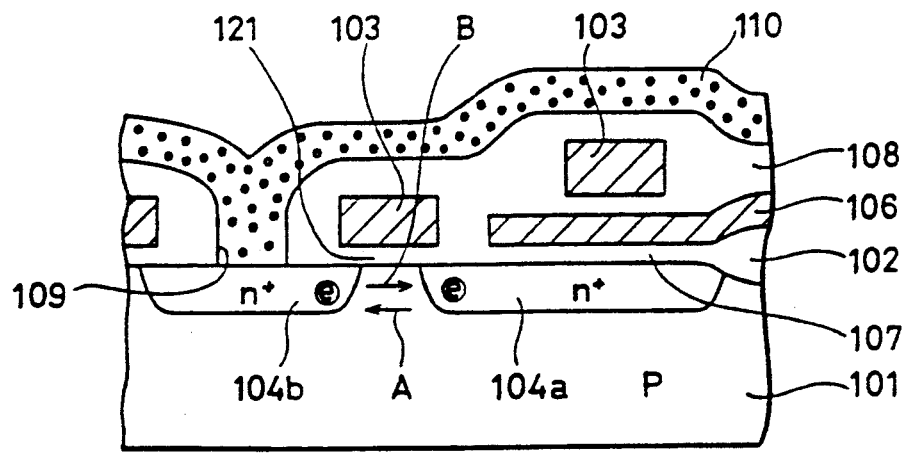
FIG. 12 is a sectional view taken along a line XII—XII of FIG. 11.

Referring to FIG. 8K, a capacitor oxide film 7 having a film thickness of 70 Å is formed on a capacitor diffusion region 5c. A capacitor electrode 6 is formed so as to have a width of about 3 μm in correspondence with the capacitor diffusion region 5c on the capacitor oxide film 7. N+ impurity diffusion regions 5a and 5b which will be source/drain regions are formed such that they have depth of about 0.2 μm and an impurity concentration on the order of $10^{20}/cm^3$ due to a thermal diffusion of the n type impurities from the source/drain electrodes 4a and 4b into the p type silicon layer 5 by a series of heat treatment, for example, heat treatment at the temperature of 900° C. for 30 minutes, completing a memory cell according to the present invention.

In the above embodiments, although a description is given for an example in which the field effect transistor is arranged under the p type silicon layer 5 and the capacitor is arranged on the p type silicon layer 5, the field effect transistor and the capacitor may be changed in an arrangement.

In addition, although in the above described embodiments, the memory cell is structured by an n channel field effect transistor, it may be structured by a p channel field effect transistor in an opposite conductive manner.

As the foregoing, according to the present invention, the surface area occupied by each memory cell comprising a field effect transistor and a capacitor becomes small, so that the memory cell can be miniaturized.

In addition, since the electric charges are stored in the capacitor using the impact ionization phenomenon, the writing operation of data in the memory cell can be performed even if the amount of currents flowing between one and the other impurity regions of the field effect transistor is small. As a result, the structure of the memory cell according to the present invention can contribute to a reduction of power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device comprising the steps of:
    forming a gate electrode on a major surface of an insulation layer;
    forming a gate insulating film on a surface of said gate electrode,
    forming a semiconductor layer of a first conductivity type having a first surface being in contact with the major surface of said insulation layer and a surface of said gate insulation film and a second surface located opposite to said first surface;
    forming one and the other impurity regions of a second conductivity type located spaced apart from each other in said semiconductor layer so as to define a channel region with a channel surface being a part of the first surface;
    forming a capacitor impurity region of the first conductivity type having a concentration higher than that of said semiconductor layer so as to be opposed to said channel region, near the second surface of said semiconductor layer; and
    forming a capacitor electrode on said capacitor impurity region through a dielectric film.

2. A method of manufacturing a semiconductor memory device according to claim 1, wherein said step of forming a gate electrode comprises:
    forming a concave portion on the major surface of said insulation layer; and
    forming a conductive layer so as to fill in said concave portion.

3. A method of manufacturing a semiconductor memory device according to claim 1, wherein said step of forming one and the other impurity regions of the second conductivity type comprises:
    forming one and the other polycrystalline silicon layers including the second conductivity type impurities located spaced apart from each other on the major surface of said insulation layer; and
    forming one and the other impurity regions of the second conductivity type by doping impurities of the second conductivity type from said one and the other polycrystalline silicon layers to said semiconductor layer.

* * * * *

UNITED STATES PATENT AND TRADEMARK OFFICE
CERTIFICATE OF CORRECTION

PATENT NO. : 5,270,242
DATED : December 14, 1993
INVENTOR(S) : Hidekazu ODA et al.

It is certified that error appears in the above-indentified patent and that said Letters Patent is hereby corrected as shown below:

On title page, and in col. 1, lines 1-5 delete the title of the invention and insert the following therefor:

--METHOD FOR FABRICATING DYNAMIC RANDOM ACCESS MEMORY DEVICE HAVING A CAPACITOR FOR STORING IMPACT IONIZATION CHARGES--

Signed and Sealed this

Fifth Day of July, 1994

Attest:

BRUCE LEHMAN

*Attesting Officer*     *Commissioner of Patents and Trademarks*